United States Patent [19]
Hirano et al.

[11] Patent Number: 6,120,338
[45] Date of Patent: Sep. 19, 2000

[54] METHOD OF MANUFACTURING ORGANIC EL DISPLAY

[75] Inventors: Takashi Hirano; Tatsuya Sasaoka; Mitsunobu Sekiya; Naoki Sano, all of Kanagawa; Tetsuo Nakayama, Tokyo, all of Japan

[73] Assignee: Sony Corporation, Tokyo, Japan

[21] Appl. No.: 09/415,369

[22] Filed: Oct. 8, 1999

[30] Foreign Application Priority Data

Oct. 8, 1998 [JP] Japan .................................. 10-286163

[51] Int. Cl.⁷ .................................................. H05B 33/10
[52] U.S. Cl. ........................................... 445/24; 313/505
[58] Field of Search ................................ 313/505; 445/24

[56] References Cited

U.S. PATENT DOCUMENTS

| | | | |
|---|---|---|---|
| 3,904,924 | 9/1975 | Hilsum et al. | 313/505 |
| 5,736,754 | 4/1998 | Shi et al. | 313/505 |

*Primary Examiner*—Kenneth J. Ramsey
*Attorney, Agent, or Firm*—Hill & Simpson

[57] ABSTRACT

The present invention provides a method of manufacturing an organic EL display capable of decreasing the resistance of scanning-side electrodes, and improving the efficiency of utilization of light emitted in organic layers. In the manufacturing method, stripe first electrodes made of a transparent conductive material are formed in parallel on a transparent substrate, and then an insulation layer is formed on the transparent substrate with the apertures formed above the first electrodes. An organic film 24 composed of a film of an organic luminescent material, a second electrode material film and a protecting film is laminated in this order on the transparent substrate to cover the insulation layer, and then independent island resist patterns are formed on the protecting film. Then, a laminated film composed of the organic film, the second electrode material film and the protecting film is etched using the resist patterns as a mask to pattern independent island laminations each composed of an organic layer, a second electrode, and a protecting layer.

19 Claims, 8 Drawing Sheets

METHOD OF MANUFACTURING ORGANIC EL DISPLAY

RELATED APPLICATION DATA

The present application claims priority to Japanese Application No. P10-286163 filed Oct. 8, 1998 which application is incorporated herein by reference to the extent permitted by law.

BACKGROUND OF THE INVENTION

1. Field of the Invention

The present invention relates to an EL (Electroluminescence) display comprising electroluminescence devices.

2. Description of the Related Art

In an organic EL display comprising many pixels composed of organic electroluminescence devices (referred to as "organic EL devices" hereinafter), a voltage is applied to the organic EL devices to inject electrons and holes to organic luminescent layers from cathodes and anodes, respectively, and recombination of the electrons and holes occurs in the organic luminescent layers to emit light.

Figure 8:
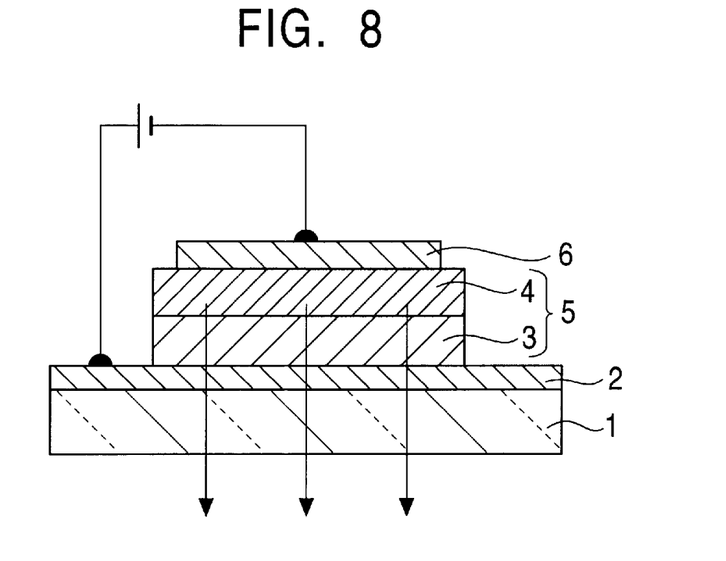
FIG. 8 is a sectional side view showing the schematic construction of a conventional single hetero organic EL device.

As the organic EL devices provided in such an organic EL display, for example, the single hetero organic EL device shown in FIG. 8 can be used. This organic EL device comprises an anode 2 made of a transparent conductive film of ITO (Indium tin oxide), or the like and provided on a transparent substrate 1 such as a glass substrate; an organic layer 5 comprising a hole transport layer 3 and a luminescent layer 4 provided on the anode 2; and a cathode 6 made of aluminum or the like; which are provided in this order on the substrate 1.

On the basis of the above construction, in the organic EL device, when positive and negative voltages are applied to the anode 2 and the cathode 6, respectively, the holes ejected from the anode 2 reach the luminescent layer 4 through the hole transport layer 3, and the electrons ejected from the cathode 6 reach the luminescent layer 4 to produce recombination of the electrons and holes in the luminescent layer 4. At this time, light at a predetermined wavelength is produced, and emitted outward from the transparent substrate side, as shown by arrows in FIG. 8.

Therefore, many organic EL devices are arranged in, for example, a matrix form, to form the above-described organic EL display.

Figure 9:
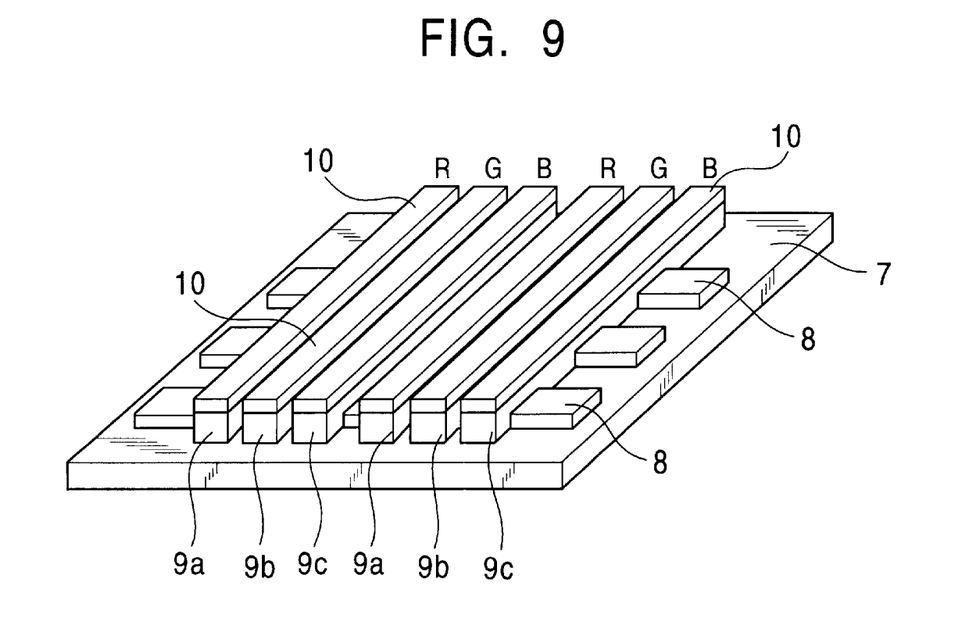
FIG. 9 is a perspective view showing the schematic construction of an example of conventional organic EL displays.

FIG. 9 shows an example of conventional such organic EL displays. The organic EL display shown in FIG. 9 comprises stripe transparent electrodes 8 provided as anodes on a transparent substrate 7, stripe organic layers 9a, 9b, and 9c each comprising a hole transport layer and a luminescent layer and provided on the transparent electrodes 8 perpendicularly thereto, and stripe cathodes 10 respectively provided on the stripe organic layers 9a, 9b, and 9c, and having substantially the same dimensions as the stripe organic layers 9a, 9b, and 9c. Each of the stripe organic layers 9a, 9b, and 9c has luminescent properties corresponding to one of red (R), green (G), and blue (B) so that the organic EL display becomes a full-color or multi-color display.

Figure 10:
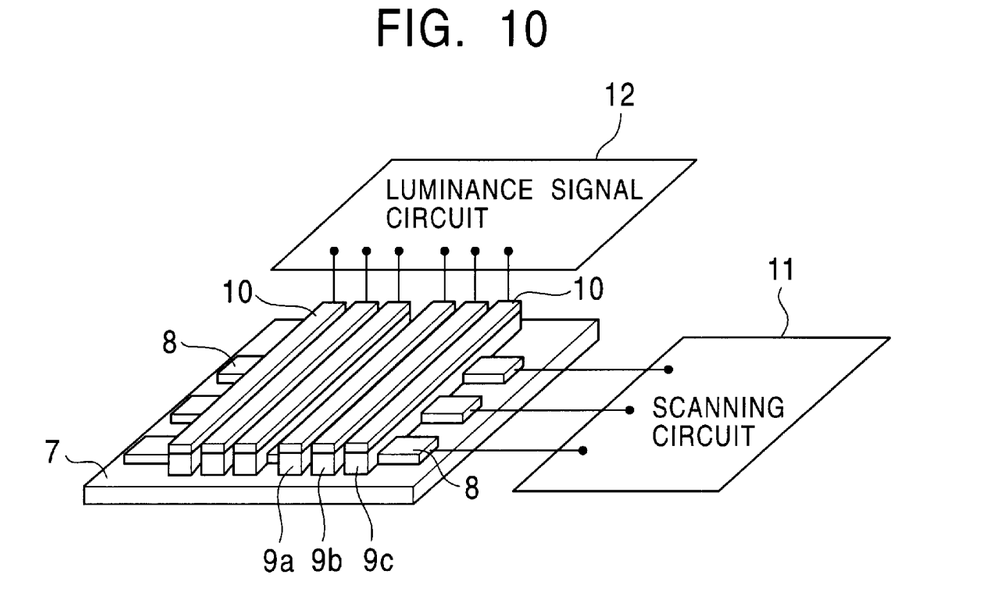
FIG. 10 is a perspective view showing connection of driving circuits in the organic EL display shown in FIG. 9.

The image display of this color organic EL display will be described below. In the color organic EL display, as shown in FIG. 10 a scanning circuit 11 is connected to the transparent electrodes 8, and a luminance signal circuit 12 is connected to the cathodes 10. Signal voltages are applied to the organic layers 9a to 9c at the intersections of the transparent electrodes 8 and the cathodes 10 by the scanning circuit 11 and the luminance signal circuit 12 to emit light from the organic layers 9a to 9c. Therefore, such control causes the organic EL display to function as an image reproducer.

In order to manufacture the organic EL display shown in FIG. 9, conventionally, a plurality of the stripe transparent electrodes 8 comprising a transparent conductive film are formed in parallel on the transparent substrate 7. A physical deposition method such as sputtering or the like is frequency used for depositing the transparent conductive film. The transparent conductive film is processed to form stripes by conventional known lithography and etching techniques.

After the transparent electrodes 8 are formed, a plurality of the organic layers 9a to 9c, and the cathodes 10 are formed. The organic layers 9a to 9c, and the cathodes 10 are formed by vacuum deposition using a mask having stripe apertures. In a color display such as the organic EL display shown in FIG. 9, for example, the organic layers 9a corresponding to red (R), and the cathodes 10 formed thereon are deposited by using the same mask, and then the mask is changed (or the mask is moved) so that the organic layers 9b and 9c corresponding to green (G) and blue (B), and the cathodes 10 formed thereon are formed by the same method.

However, such a conventional manufacturing method employs the mask deposition method for forming the patterns of the organic layers 9a to 9c, and the cathodes 10, and thus has the disadvantage described below.

Namely, the pattern formation by the mask deposition method has limits of alignment precision of the mask, and processing precision of the mask, and is difficult to form a fine pattern, thereby causing difficulties in producing a high-definition display.

As a method of manufacturing an organic EL display, which is capable of forming a fine pattern with high precision, and solving the above disadvantage, the technique disclosed in Japanese Unexamined Patent Publication No. 9-293589 is known.

This method comprises the lamination step of laminating in turn an organic film, a cathode material film, and a protecting film on a transparent substrate on which cathodes (transparent electrodes) made of a transparent conductive material are formed, the resist pattern forming step of forming a resist pattern in a desired shape on the protecting film, and the patterning step of processing the laminated film comprising the organic film, the cathode material film and the protecting film by a dry etching method using the resist pattern as a mask to form organic layers, cathodes and protecting layers in a desired shape. The steps of coating a resist on the protecting film and processing the laminated film by dry etching are repeated at least once to finely pattern the organic layers and cathodes.

However, such a method also has the disadvantages below.

In dry-etching the protecting film, the cathode material film, the organic film using the resist pattern as the mask, the etching residue of the cathode material film having conductivity (electric conductivity) adheres to the etching-side walls of the organic layers made of the organic film, thereby causing the probability of causing short circuits between the obtained cathodes and anodes. The occurrence of the short circuits between the cathodes and the anodes makes impossible the selection of a pixel in the display, and thus makes it impossible for the resultant organic EL display to function as a display.

In the method of manufacturing the organic EL display, the step of depositing the organic film, the cathode material film, the protecting film, and the resist film, and the step of processing the laminated film comprising the organic film, the cathode material film, and the protecting film by dry etching are repeated to pattern the organic layers. Therefore, the organic layers are formed below the stripe cathodes along the length direction thereof. For example, in manufacturing a simple matrix organic EL display, thus, the electrodes on the scanning side are necessarily anodes.

However, in the simple matrix system, a current of 100 to 1000 times as large as the current of the signal side electrodes flows through the scanning-side electrodes, and the voltage drop in the scanning electrodes is significantly increased because the scanning-side electrodes serving as anodes are made of a material such as ITO or the like, which has resistance of about 100 times as high as metals. Such an increase in voltage drop in the scanning electrodes causes variations in luminance of the display, and an increase in power consumption.

In the organic EL display obtained by the above-described method, the organic layers are formed over the lower sides of the cathodes along the length direction thereof, thereby causing the disadvantage below.

Figure 11:
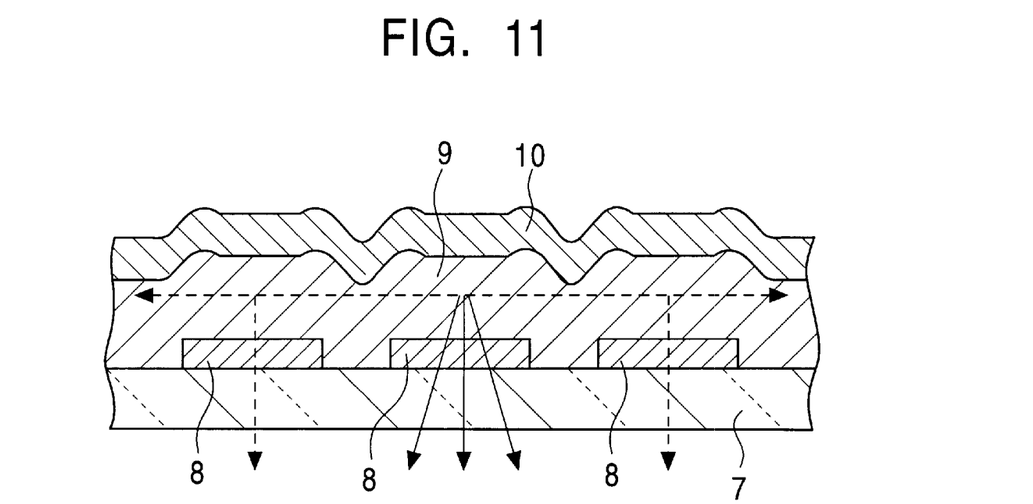
FIG. 11 is a sectional side view of a principal portion, illustrating the problems of a conventional organic EL display.

Since the organic layers have photoconductivity (optical waveguide), a part of light produced in the organic layers 9 is guided transversely to the transparent substrate 7 through the organic layers 9, as shown by arrows in FIG. 11. As a result, part of the light is attenuated during guide, the residue being released from the peripheral pixels and lost.

Namely, it is preferable that the light emitted in the organic layers 9 are entirely passed through the transparent electrodes 8 and the transparent substrate 7 and emitted to outside of the organic EL display to be used as display light. However, in the organic EL display obtained by the conventional manufacturing method, part of the light emitted in the organic layers 9 is not used as display light, decreasing the efficiency of utilization of light, and decreasing luminance.

Also, part of the light transversely guided to the transparent substrate 7 through the organic layers 9 is released from the organic layers 9, which constitute the peripheral pixels, and emitted to the outside of the transparent substrate 7, and thus cross talk occurs due to interference in the originally produced light, causing the probability of deterioration in color reproducibility.

SUMMARY OF THE INVENTION

The present invention has been achieved in consideration of the above situation, and an object of the present invention is to provide a method of manufacturing an organic EL display which is capable of decreasing the resistance of scanning-side electrodes, and increasing the efficiency of effective utilization of light emitted in organic layers.

As a means for solving the above problems, a method of manufacturing an organic EL display of the present invention comprises the first electrode forming step of forming, in parallel, a plurality of stripe first electrodes made of a transparent conductive material on a light transmissive substrate, the insulating layer forming step of forming an insulating layer having a plurality of apertures formed above the first electrodes, the lamination step of laminating an organic film comprising a film of an organic luminescent material, a second electrode material film and a protecting film in this order, the resist pattern forming step of forming a plurality of resist patterns into independent islands on the protecting film immediately above the apertures, and the pattering step of etching the laminated film comprising the organic film, the second electrode material film, and the protecting film using the resist patterns as a mask to pattern laminations each comprising an organic layer, a second electrode and a protecting layer into independent islands.

In this manufacturing method, the laminated film comprising the organic film, the second electrode material film and the protecting film is etched by using the resist patterns as a mask to pattern the laminations each comprising the organic layer, the second electrode, and the protecting layer into independent islands, forming the organic layers into independent islands. Therefore, stripe third electrodes are formed to cross the first electrodes at right angles and cover the laminations, to permit desired arrangement and combination of the organic layers, cathodes and anodes. This permits any desired selection and arrangement of pixels comprising organic EL devices, and the electrodes as components of the pixels. Therefore, for example, in a color organic EL display, a conductive material having low resistance can be used for scanning-side electrodes through which a large current flows. In addition, the lamination step, the resist pattern forming step and the patterning step are repeated in this order to form the organic layers corresponding to each of a plurality of colors, e.g., red (R), green (G), and blue (B). In this case, arrangement of each of these colors red (R), green (G) and blue (B) can be made delta arrangement.

Furthermore, by covering the independent island laminations with the stripe third electrodes, light emitted in the organic layers of the laminations can be efficiently taken out as display light from the transparent substrate side without being guided to other organic layers.

DESCRIPTION OF THE PREFERRED EMBODIMENT

The present invention will be described in detail below with reference to an embodiment.

FIGS. 1(a) to 1(d), FIGS. 2(a) to 2(c), and FIGS. 3(a) to 3(c) are drawings showing an embodiment in which a method of manufacturing an organic EL display of the present invention is applied to a method of manufacturing a simple matrix full color organic EL display, illustrating the steps in order.

Figure 1A:
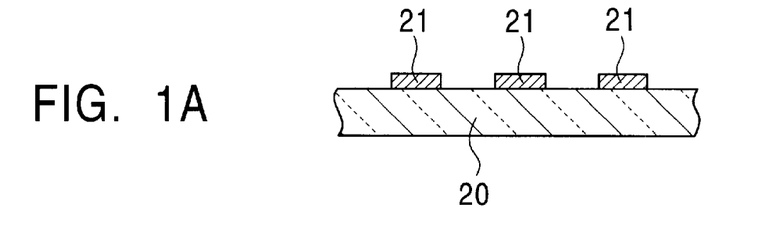
FIGS. 1(a) to 1(d) are sectional side views of a principal portion, illustrating the steps of a method of manufacturing an organic EL display in accordance with an embodiment of the present invention.

In this embodiment, as shown in FIG. 1(a), a light transmissive substrate, i.e., a transparent substrate 20, is first prepared, and a plurality of stripe transparent electrodes (first electrodes) 21 made of a transparent conductive material are formed in parallel on the transparent substrate 20. For the transparent substrate 20, the material is not limited, but it preferably has excellent light transmittance. This embodiment uses a glass substrate. As the material (transparent conductive material) of the transparent electrodes 21 serving as anodes, it preferably has excellent light transmittance and good electric conductivity. This embodiment uses ITO.

In order to form the transparent electrodes 21 made of ITO, an ITO film is formed on the transparent substrate 20 by a physical deposition method such as sputtering or the like, and then patterned into stripes by lithography and etching. In this embodiment, the thickness of the transparent electrodes 21 is about 200 nm.

Figure 1B:
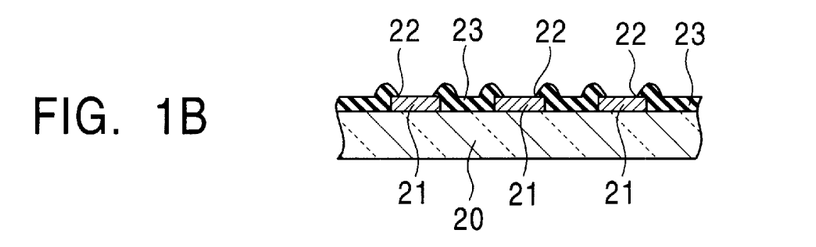

Next, as shown in FIG. 1(b), an insulating layer 23 having apertures formed above the transparent electrodes 21 is formed on the transparent substrate 20. A material having good insulation properties and good adhesion to the ground is preferable as the material of the insulating film 23, and this embodiment uses silicon nitride.

In forming the insulating film 23, silicon nitride is first deposited to a thickness of about 300 nm by the CVD process. As reaction gases, mixed gases containing monosilane, ammonia and nitrogen are used. Then, apertures are formed in the formed insulating film (not shown) by known lithography and reactive ion etching (RIE) techniques to form apertures 22 in the insulating layer 23. As reactive gases for RIE, mixed gases containing carbon tetrafluoride and oxygen are used.

Although the shape of the apertures 22 is not limited, in this embodiment, the apertures have a rectangular plane shape and are formed independently. As the edge shape of the apertures 22, the inner wall of each of the apertures 22 is preferably tapered so that it is gradually included from the center to the outside in the upward direction, as shown in FIG. 1(b).

Figure 1C:
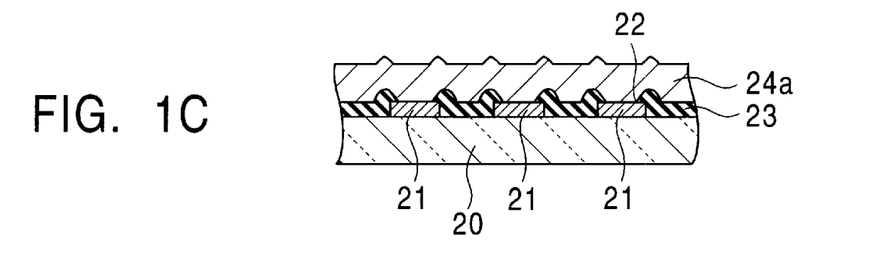

Next, as shown in FIG. 1(c), an organic film 24a corresponding to red (R) is formed on the transparent substrate 20 by vacuum deposition to cover the transparent electrodes 21. The organic film 24a comprises at least a hole transport layer, a luminescent layer made of an organic luminescent material, and an electron transport layer, and is formed to a thickness of about 100 nm in this embodiment.

Then, a second electrode material is deposited on the organic film 24a, and a protecting film 26 is further formed on the second electrode material film 25. In this way, the second electrode material film 25 and the protecting film 26 are laminated on the organic film 24a to obtain a laminated film 27a. As the second electrode material, aluminum or an alloy thereof is preferably used; this embodiment uses aluminum. As the protecting film 26, a material having excellent denseness, water repellency, and adhesion to the ground, and electric conductivity is preferable; this embodiment uses amorphous silicon containing a high concentration of phosphorus (P) as an impurity.

The second electrode material film 25 is formed by vacuum deposition, and the protecting film 26 is formed by the CVD process having good coating properties. As reactive gases for the CVD process, mixed gases of monosilane, hydrogen, and phosphine are used. In order to form the protecting film 26, deposition methods other than CVD process, such as sputtering and the like, may be used.

Figure 1D:
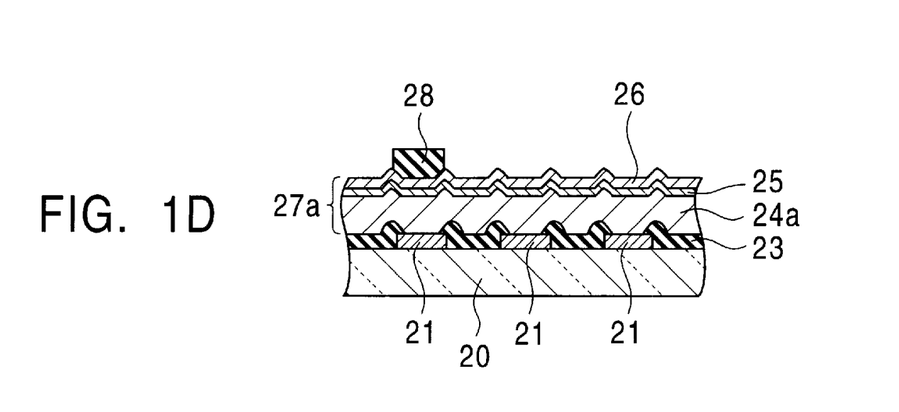

Next, a photoresist is coated on the protecting film 26 to form a resist film having a thickness of about 1.0 μm, and the thus-obtained resist film is patterned by exposure and development to form many independent island resist patterns 28 having a rectangular plane shape directly above the apertures 22, as shown in FIG. 1(d).

In the second electrode material film 25 made of aluminum or the like, when the film 25 is thin, pin holes easily occur in the film. Therefore, in coating the photoresist directly on the second electrode material film 25, even when only few pin holes are present in the second electrode material film 25, the organic solvent in the photoresist reaches the organic film 24a through the pin holes to erode the organic film 24a. However, in this embodiment, since the second electrode material film 25 is covered with the protecting film 26 made of amorphous silicon and is very difficult to produce pin holes, erosion of the organic film 24a with the organic solvent is prevented.

Figure 2A:
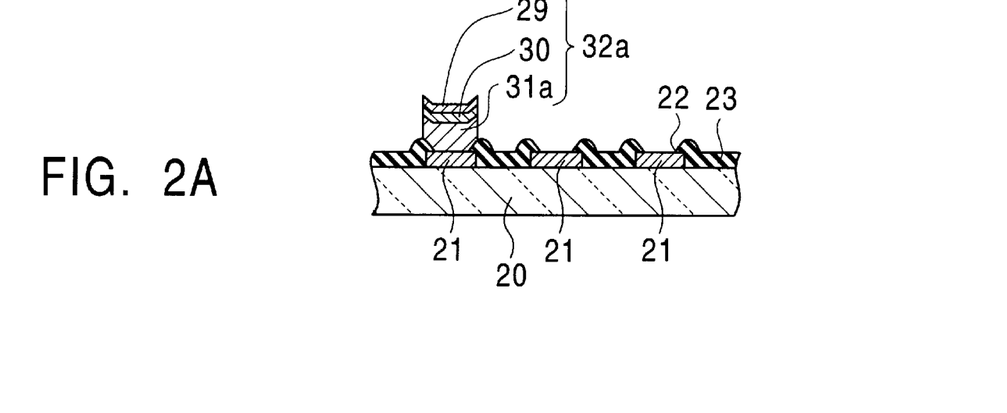
FIGS. 2(a) to 2(c) are sectional side views of a principal portion, illustrating the steps subsequent to the step shown in FIG. 1(d) which shows a method of manufacturing an organic EL display in accordance with an embodiment of the present invention.

Next, the laminated film 27a, i.e., the protecting film 26 made of amorphous silicon, the second electrode material film 25 made of aluminum, and the organic film 24a, is etched in this order by the RIE (reactive ion etching) process using the resist patterns 28 as a mask to pattern the film, to obtain protecting layers 29, second electrodes 30, and organic layers 31a, as shown in FIG. 2(a). Then, the resist patterns 28 are removed by ashing to form independent island laminations 32a corresponding to red, as shown in FIG. 2(a). In this step, as the etching gas, mixed gases of boron trichloride and chlorine are used for the protecting film 26 made of amorphous silicon, and the second electrode material film 25 made of aluminum; oxygen is used for the organic film 24a.

Such patterning permits the formation of the protecting layers 29, the cathodes 30, and the organic layers 31a having substantially the same dimensions as the resist patterns 28 because the RIE method comprises anisotropic etching, and causes no under cut. Therefore, fine pattering can be carried out.

The above-described step of forming the laminations 32a corresponding to red is repeated to form in turn laminations 32b corresponding to green, and laminations 32c corresponding to blue.

Figure 2B:
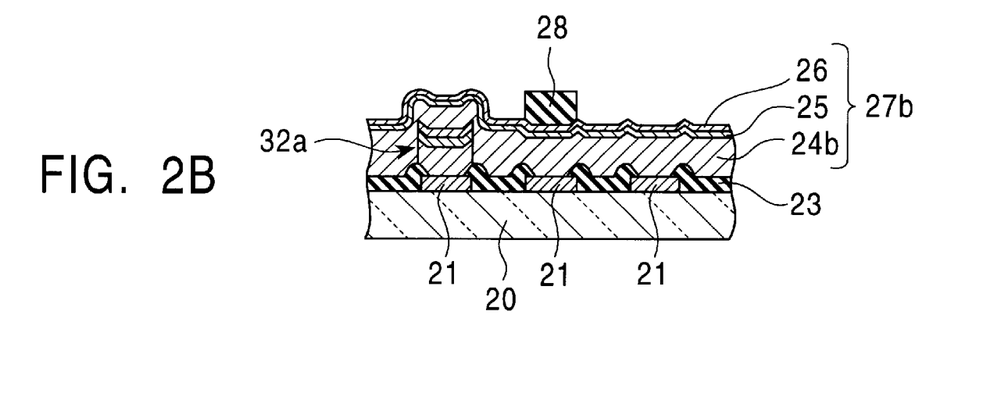

Namely, an organic film 24b corresponding to green (G) is first formed on the transparent substrate 20 by vacuum deposition, as shown in FIG. 2(b). Like the organic film 24a for red, the organic film 24b for green also comprises at least a luminescent layer composed of an organic luminescent material and an electron transport layer.

Then, the second electrode material is deposited on the organic film 24b, and the protecting film 26 is further formed on the second electrode material film 25. In this way, the second electrode material film 25, and the protecting film 26 are laminated on the organic film 24b to obtain a laminated film 27b.

Furthermore, many independent island resist patterns 28 having a rectangular plane shape are formed on the protecting film 26 directly above the apertures 22.

Figure 2C:
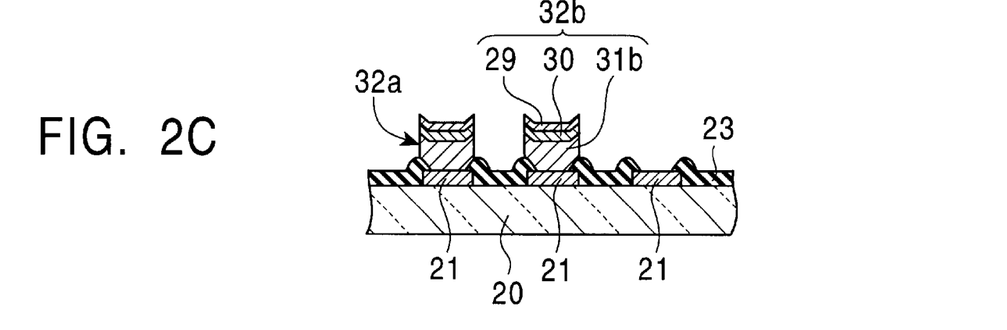

Next, the laminated film 27b, i.e., the protecting film 26, the second electrode material film 25, and the organic film 24b, is etched in this order by the RIE process using the resist patterns 28 as a mask to pattern the film, to obtain the laminations 32b each comprising the protecting layer 29, the second electrode 30, and an organic layer 31b, as shown in FIG. 2(c).

Figure 3A:
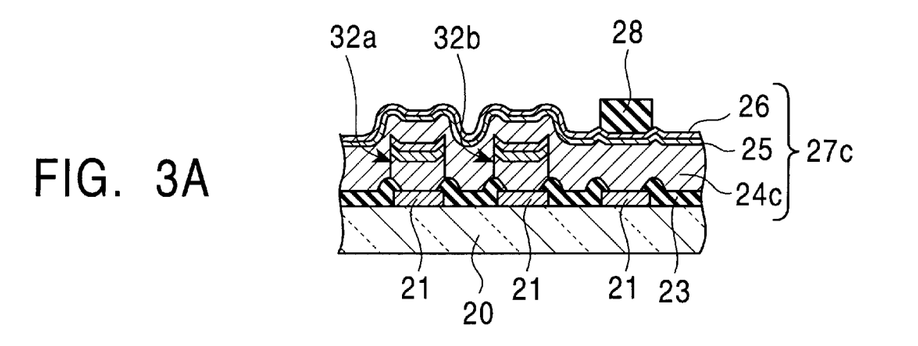
FIGS. 3(a) to 3(c) are sectional side view of a principal portion, illustrating the steps subsequent to the step shown in FIG. 2(c) which shows a method of manufacturing an organic EL display in accordance with an embodiment of the present invention.
Figure 3B:
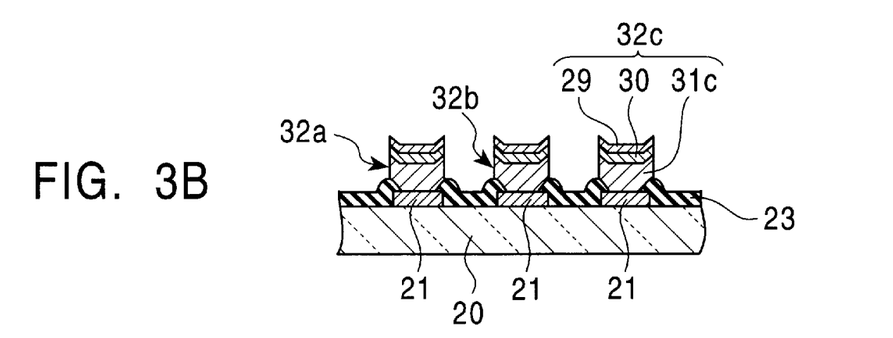

Next, similarly, as shown in FIG. 3(a), an organic film 24c corresponding to blue (B), the second electrode material film 2, and the protecting film 26 are formed to obtain a laminated film 27c, and the island resist patterns 28 are formed directly above the apertures 22. Next, the laminated film 27c is patterned by the RIE process using the resist patterns 28 as a mask to form the laminations 32c each comprising the protecting layer 29, the second electrode 30, and an organic layer 31c, as shown in FIG. 3(b).

Figure 3C:
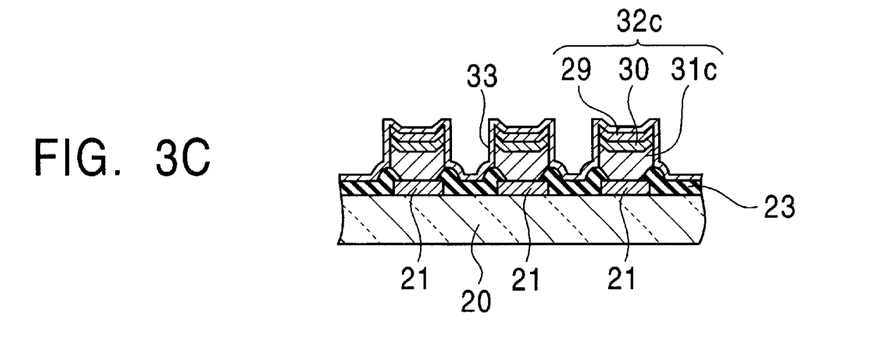
Figure 4:
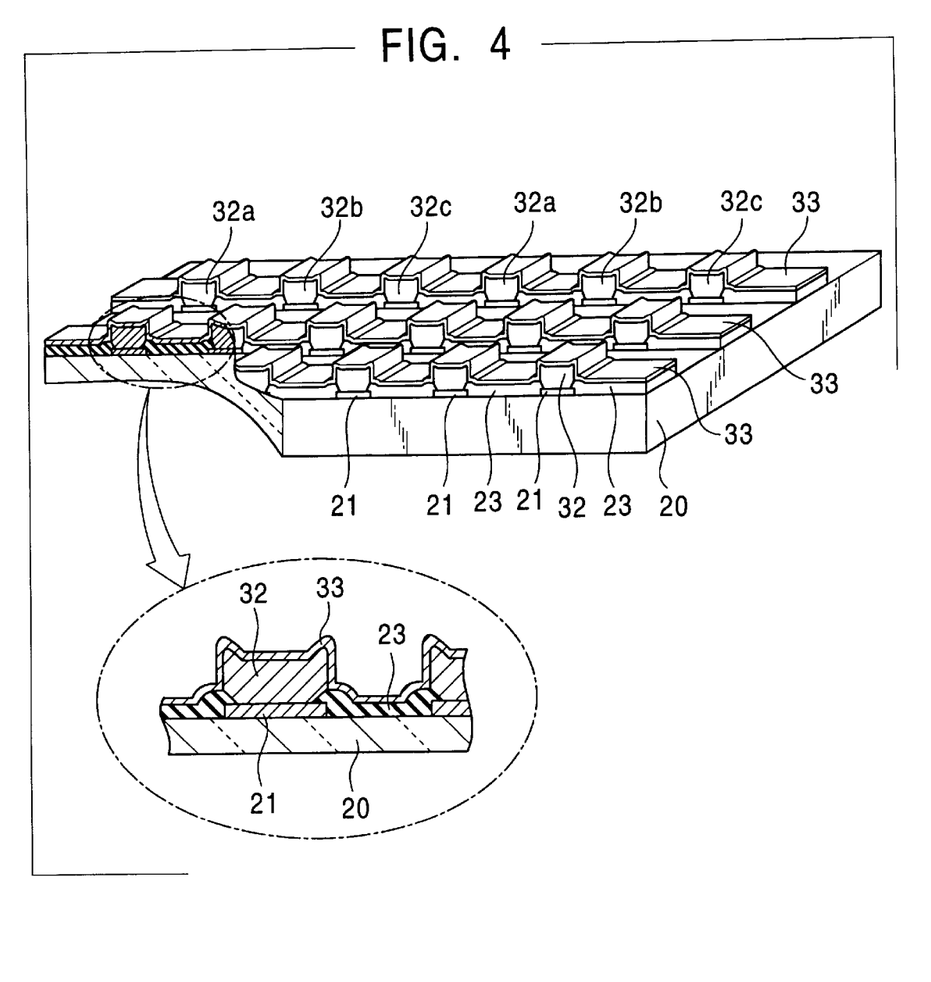
FIG. 4 is a perspective view showing the schematic construction of an organic EL display obtained by a method of manufacturing an organic EL display in accordance with an embodiment of the present invention.

Next, as shown in FIGS. 3(c) and 4, a plurality of stripe third electrodes 33 are formed in parallel to cross the transparent electrodes 21 at right angles and cover the laminations 32a, 32b, and 32c which are aligned in the direction perpendicular to the transparent electrodes 21.

In forming the third electrodes 33, a conductive material (in this embodiment, aluminum) is first deposited to a thickness of about 300 nm by vacuum deposition, and a second protecting film (not shown) made of amorphous silicon is then deposited to a thickness of about 100 nm on the thus-obtained conductive material film (not shown) by the plasma CVD process. Then, a resist is coated to a thickness of about 1.0 m on the second protecting film, and patterned into predetermined stripes by exposure and development. Then, the conductive material film and the second protecting film are patterned by the RIE process using the resultant resist patterns as a mask. After the completion of etching, the resist patterns are removed by ashing.

Such formation of the third electrodes 33 enables electric connection of the laminations 32a, 32b and 32c which are aligned in the direction perpendicular to the transparent electrodes 2, thereby permitting the third electrodes 33 to function as cathodes.

The third electrodes 33 formed as described above preferably have a width which allows the organic layers 31a, 31b and 31c in the laminations 32a, 32b, and 32c, respectively, to securely be covered, i.e., the exposed side walls of the organic layers 31a, 31b, and 31c to be covered. The third electrodes 33 formed to cover the organic layers 31a, 31b and 31c prevents emitted light of the organic layers 31a (31b or 31c) from outgoing from sides other than the transparent substrate side, and thus encloses the emitted light in the organic layers 31a (31b or 31c), causing the light to outgo from the transparent substrate side through the apertures 22 and the transparent electrodes 21.

In etching during the formation of the third electrodes 33, erosion of the organic layers 31a, 31b and 31c from the side walls thereof is also prevented.

In this embodiment, aluminum in which pin holes are easily produced is used as the conductive material, and thus there is the probability that the organic solvent of the resist permeates into the organic layers 31a (31b or 31c) through the side walls thereof. However, since the second protecting film made of amorphous silicon having great difficulty in producing pin holes is provided on the conductive material film, erosion of the organic layers 31a with the organic solvent is prevented.

Then, an insulation protecting film (not shown) is further formed to cover the third electrodes 33, to obtain a full color organic EL display.

In the above-described method of manufacturing the organic EL display, the laminations 32a, 32b, and 32c each comprising the organic layers 31a, (31b or 31c), the second electrodes 30 and the protecting layers 29 are patterned into independent islands to form the independent island organic layers 31a, 31b, and 31c. Therefore, in simple matrix system driving, as shown in FIG. 5, a luminance signal circuit 12 can be connected to the transparent electrodes 21 made of ITO, and a scanning circuit 11 can be connected to the third electrodes 33 made of aluminum having low resistance.

Figure 5:
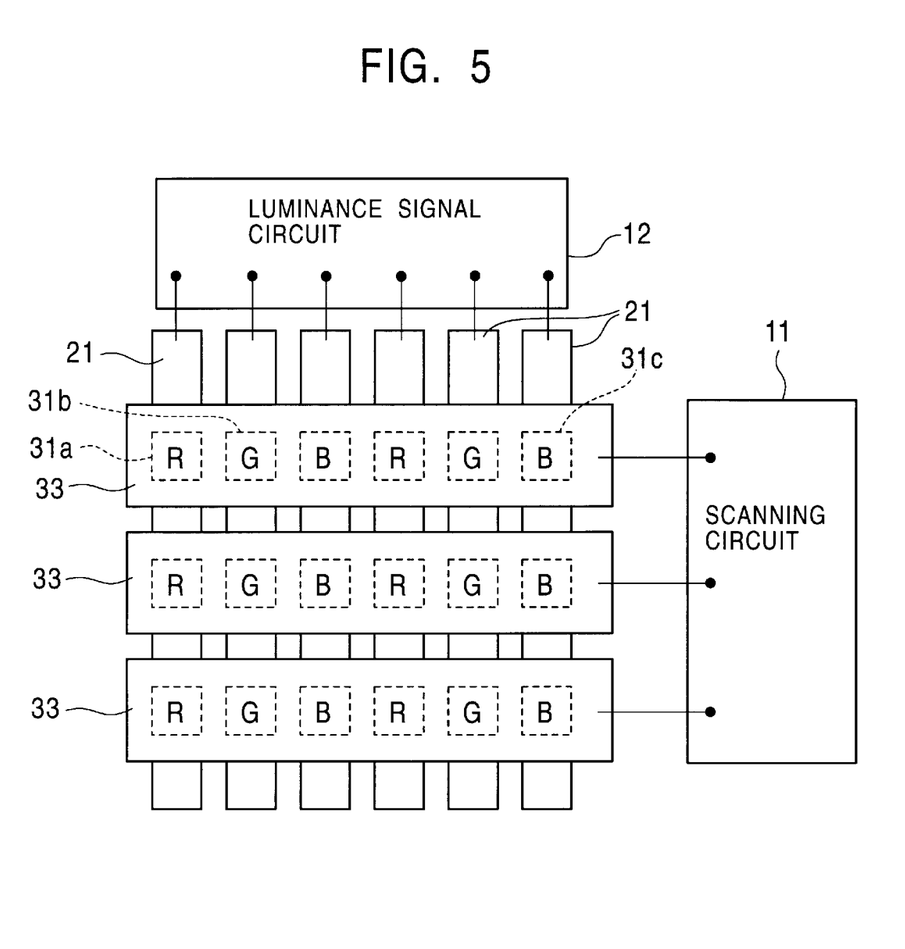
FIG. 5 is a drawing showing connection of driving circuits of an organic EL display obtained in the present invention.

Therefore, as shown in FIG. 5, the luminance signal circuit 12 and the scanning circuit 11 are connected to each of the electrodes to drive the electrodes in the simple matrix system, thereby decreasing a voltage drop in the transparent electrodes 21. As a result, the voltages applied to the organic layers 31a, 31b, and 31c, which constitutes pixels, can be substantially uniformed, uniforming emission luminance.

Also the electric power consumed in the transparent electrodes 21 can be decreased to a negligible level, thereby decreasing power consumption.

Figure 6:
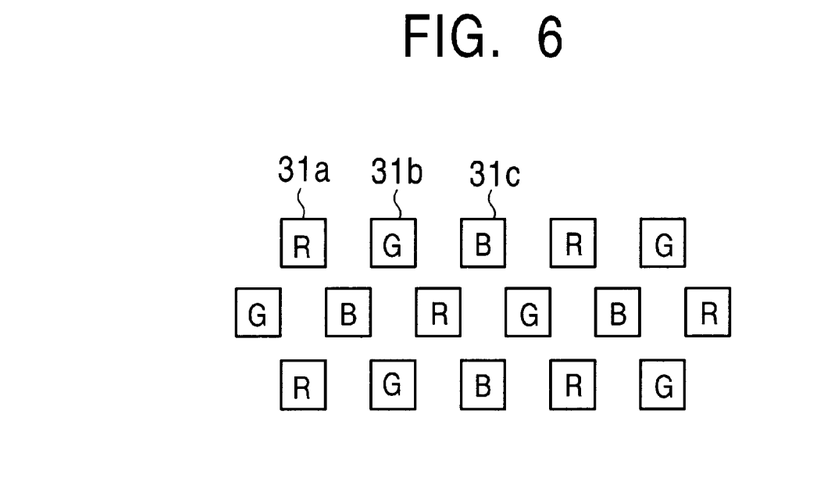
FIG. 6 is a plan view showing a modified example of pixel arrangement in an organic EL display obtained in the present invention.

Since the organic layers 31a, 31b and 31c are formed into independent islands, the organic layers 31a, 31b and 31c can be arranged in any desired form, and thus unit pixels composed of each of the organic layers 31a (31b or 31c) can also be arbitrarily arranged. Therefore, pixels corresponding to each of red (R), green (G) and blue (B) can be arranged in a delta form, as shown in FIG. 6.

Figure 7:
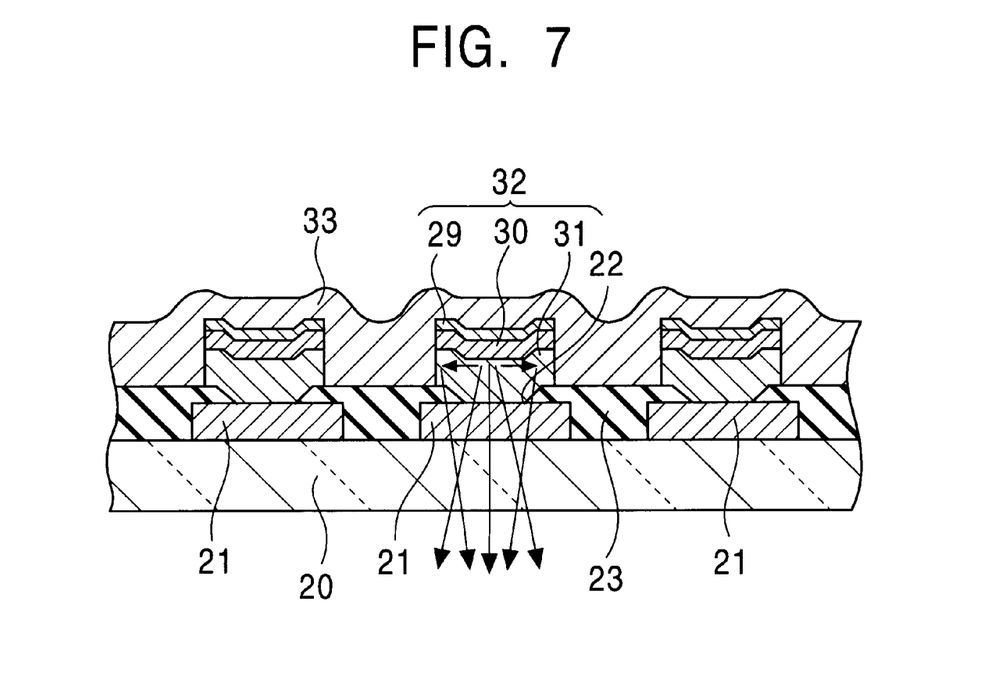
FIG. 7 is a sectional view of a principal portion, illustrating the function of an organic EL display obtained in the present invention.

Since the organic layers 31a, 31b and 31c are formed into independent islands, and the sides of the organic layers 31a, 31b and 31c are covered with the third electrodes 33, light emitted in the organic layers 31a (31b or 31c) is reflected without being propagated to the outside through the upper surfaces and the sides thereof. As a result, almost all light is propagated to the transparent substrate 20 from the lower surfaces of the organic layers through the apertures 22 and the transparent electrodes 21, and then outgoes to the outside.

Therefore, the light emitted in the organic layers 31a, 31b and 31c can be effectively utilized to permit the achievement of a display having high luminance and excellent color reproducibility. Such an effect can be obtained not only in a color organic display but also in a monochromatic organic EL display.

Dry-etching the protecting film 26, the second electrode material film 25, and the organic film 24a (24b or 24c) has the probability that the etching residue of the second electrode material film 25 adheres to the etching-side walls of the organic layers 31a (31b or 31c). However, since the insulation layer 23 having the apertures 22 is formed on the transparent electrodes 21, it is possible to prevent short circuits between the transparent electrodes 21 and the third electrodes 33 serving as cathodes from occurring due to the adhesion of the etching residue to the etching-side walls of the organic layers 31a (31b or 31c).

In addition, since the inner walls of the apertures 22 of the insulation layer 23 are tapered, the step coverage of the organic film 24a (24b or 24c) formed to cover the apertures 22 can be improved. It is thus possible to prevent electric short circuits between the transparent electrodes 21 and the third electrodes 33 from readily occurring due to the insufficient step coverage of the film 24a (24b or 24c) at the side edges of the transparent electrodes 21.

Furthermore, since the protecting film 26 (the protecting layers 29) formed to cover the second electrodes 30 not only protects the organic films 24a, 24b and 24c (the organic layers 31a, 31b, and 31c) from the organic solvent during the manufacturing process, but also remains covering the upper sides of the organic layers 31a, 31b and 31c after the manufacturing process, the protecting layers 29 function to protect the organic layers 31a, 31b, and 31c from being eroded with air.

Since each of the laminations 32a (32b or 32c) including the electrode and the organic layer 31a (31b or 31c) is processed by photolithography and etching, the processing precision can be significantly improved, thereby producing a high-definition color organic EL display. Namely, when the organic layers are patterned by a conventional deposition mask method using a deposition mask, the pitch of the organic layers is limited to 100 nm at most because of low processing precision of the mask, and low alignment precision of the mask. However, in this embodiment, photolithographic patterning can form the laminations 32a, 2b and 32c at a pitch of 20 μm or less. Such an effect can be obtained not only in a color organic EL display but also in a monochromatic organic EL display.

Although, in this embodiment, the laminations 32a, 32b and 32c are formed, leaving the protecting layers 29 on the second electrodes 30, the protecting layers 29 may be removed.

Although the second protecting film is formed on the third electrodes 33 because aluminum is used as the conductive material, when a material having difficulty in producing pin holes is used as the conductive material, the formation of the second protecting film can be omitted.

In the present invention, the dimensions and shape of the apertures 22 of the organic layer 23, and the organic layers 31a, 31b and 31c are not limited to the above-described embodiment, and any dimensions and shape can be used. Of course, the size and shape of each of the apertures 22, and the organic layers 31a, 31b and 31c may be changed according to the formation position and color thereof.

Although this embodiment uses amorphous silicon having electric conductivity (conductivity) for the protecting layers 29, an inorganic insulator can also be used. However, in this case, electric connection between the second electrodes 30 and the third electrodes 33 is insulated or made insufficient, and it is thus necessary to form though holes for connecting the second electrodes 30 and the third electrodes 33 in the inorganic insulator which constitutes the protecting layers.

Although, in the above-mentioned embodiment, description is made of a case in which the method of manufacturing an organic EL display is applied to the method of manufacturing a color organic EL display, the present invention can also be applied to the method of manufacturing a monochromatic organic EL display, as well as the method of manufacturing a TFT driving active matrix organic EL display, not a simple matrix driving organic EL display.

The organic EL display obtained by the present invention can also be used as an optical device for, for example, a light source of a dial plate. In this case, optical devices need not be arranged in a matrix. The present invention can also be applied to a spontaneous optical device of a filter for adjusting chromaticity, and an optical communication apparatus, as well as an imaging device as an application in which incident light is converted to electric signals.

As described above, the method of manufacturing an organic EL display of the present invention comprises etching a laminated film comprising an organic film, a second electrode material film and a protecting film using resist patterns as a mask to pattern the laminations each comprising an organic layer, a second electrode, and a protecting layer, to form independent island organic layers. Therefore, for example, when stripe third electrodes are formed to cover the laminations and cross first electrodes at right angles, in the obtained organic EL display, the organic layers, cathodes and anodes can be arranged and combined in any desired manner, and thus pixels each comprising an organic EL device, and electrodes as components of the devices can be selected and arranged in any desired manner. Therefore, for example, in a color organic EL display, a conductive material having low resistance can be used for scanning-side electrodes through which a large amount of current flows.

Therefore, the use of a conductive material having low resistance for the scanning-side electrodes can decrease the voltage drop in these electrodes, thereby substantially uniforming the voltages applied to the organic layers which respectively constitute the pixels, and uniforming emission luminance. Also the power consumption of the electrodes can also be decreased to a negligible level, decreasing power consumption.

In addition, the lamination step, the resist pattern forming step and the pattering step are repeated in this order to form the organic layers corresponding to each of a plurality of colors, for example, red (R), green (G) and blue (B). In this case, pixels corresponding to each of the colors red (R), green (G) and blue (B), can be arranged in any desired manner, and thus a delta arrangement of each color is possible.

In the obtained organic EL display, by covering the independent island laminations with the stripe third electrodes, the light emitted in the organic layers in the laminations can be efficiently taken out as display light from the transparent substrate side without being guided to other organic layers. Therefore, the light emitted in the organic layers can efficiently taken out as display light, thereby decreasing the driving voltage and driving current, and realizing a display having high luminance, long life, low power consumption, and high reliability.

Since the light emitted in the organic layers does not reach other pixels due to guide through the organic layers, it is possible to prevent deterioration in color reproducibility due to cross talk, and realize a display having excellent color reproducibility and high performance.

The organic layers and electrodes are patterned by the lithography and etching techniques to improve dimensional precision and alignment precision of the pixels, and decrease the size of each pixel. Thus, a high-definition organic EL display having the above-mentioned advantages can be manufactured.

Since the insulation layer having the apertures is formed between the organic layers and the first electrodes, even when the residue having electric conductivity adheres to the etching-side surfaces of the organic layers in patterning the organic layers, the second electrodes, and the protecting layers by etching, the first electrodes can be insulated from the second electrodes, thereby preventing electric short circuits between the first electrodes and the second electrodes.

In addition, since the inner walls of the apertures of the insulation layer are tapered, the step coverage of the organic film formed to cover the apertures can be improved. It is thus possible to prevent electric short circuits between the transparent electrodes 21 and the third electrodes 33 from readily occurring due to the insufficient step coverage of the film at the side edges of the transparent electrodes 21 when no insulation layer is formed.

Furthermore, since the protecting film 26 formed to cover the second electrodes not only protects the organic films from the organic solvent during the manufacturing process, but also remains covering the upper sides of the organic layers after the manufacturing process, the protecting layers function to protect the organic layers from being eroded with air, thereby increasing the life of the organic EL display.

What is claimed is:

1. A method of manufacturing an electroluminescence display comprising the steps of:

forming stripe first electrodes made of a conductive material on a transparent substrate;

forming an insulating layer on the transparent substrate with the apertures formed above the first electrodes;

forming laminations each comprising an organic film containing an organic luminescent material, a second electrode, and a protecting film, to cover the apertures; and etching the laminations to form independent island laminations.

2. A method of manufacturing an electroluminescence display according to claim 1, wherein the etching step comprises forming independent island resist patterns on the protecting film directly above the apertures, and then etching by using the resist patterns as a mask.

3. A method of manufacturing an electroluminescence display according to claim 2, wherein the lamination forming step, the resist pattern forming step and the etching step are repeated in this order.

4. A method of manufacturing an electroluminescence display according to claim 2, further comprising the step of forming stripe third electrodes to cross the first electrodes at right angles and cover the laminations.

5. A method of manufacturing an electroluminescence display according to claim 4, wherein in the third electrode forming step, the third electrodes have a width larger then that of the organic layers in the laminations so that the side walls of the organic layers are covered with the third electrodes.

6. A method of manufacturing an electroluminescence display according to claim 1, further comprising the step of forming stripe third electrodes to cross the first electrodes at right angles and cover the laminations.

7. A method of manufacturing an electroluminescence display according to claim 6, wherein in the third electrode forming step, the third electrodes have a width larger then that of the organic layers in the laminations so that the side walls of the organic layers are covered with the third electrodes.

8. A method of manufacturing an electroluminescence display according to claim 6, wherein the third electrode forming step comprises the steps of depositing a conductive material, coating a resist on the conductive material film and patterning the resist into a predetermined pattern, and patterning the conductive material film using the resist pattern as a mask.

9. A method of manufacturing an electroluminescence display according to claim 6, wherein the third electrode forming step comprises the steps of depositing a conductive material, forming a second protecting film on the conductive material film, coating a resist on the second protecting film and patterning the resist into a predetermined pattern, and patterning the conductive material film and the second protecting film using the resist pattern as a mask.

10. A method of manufacturing an electroluminescence display according to claim 1, wherein the etching step comprises dry etching the protecting film, the second electrode material film and the organic film in this order.

11. A method of manufacturing an electroluminescence display according to claim 10, wherein the dry etching comprises reaction ion etching.

12. A method of manufacturing an electroluminescence display according to claim 10, wherein as etching gas for dry etching the organic film in the etching step, single oxygen or mixed gases containing oxygen are used.

13. A method of manufacturing an electroluminescence display according to claim 1, wherein the insulating film is made of an inorganic material.

14. A method of manufacturing an electroluminescence display according to claim 1, wherein the protecting film is made of a conductive material.

15. A method of manufacturing an electroluminescence display comprising the steps of:

forming a plurality of stripe first electrodes made of a transparent conductive material in parallel on a transparent substrate;

forming an insulating layer on the transparent substrate with a plurality of apertures formed above the first electrodes;

laminating an organic film containing at least an organic luminescent material, a second electrode material film, and a protecting film on the transparent substrate to cover the apertures;

forming a plurality of independent island resist patterns on the protecting films immediately above the apertures; and etching the laminated film comprising the organic film, the second electrode material film, and the protecting film by using the resist patterns as a mask to pattern the laminated film into independent islands.

16. A method of manufacturing an electroluminescence display according to claim 15, further comprising the step of forming stripe third electrodes to cross the first electrodes at right angles and cover the laminations.

17. A method of manufacturing an electroluminescence display according to claim 16, wherein in the third electrode forming step, the third electrodes have a width larger then that of the organic layers in the laminations so that the side walls of the organic layers are covered with the third electrodes.

18. A method of manufacturing an electroluminescence display according to claim 15, wherein the insulation film is made of an inorganic material.

19. A method of manufacturing an electroluminescence display according to claim 15, wherein the protecting film is made of a conductive material.

* * * * *